US012720923B2

(12) United States Patent
Kitahama

(10) Patent No.: US 12,720,923 B2
(45) Date of Patent: Aug. 25, 2026

(54) METHOD FOR MANUFACTURING LIGHT-EMITTING ELEMENT AND LIGHT-EMITTING ELEMENT

(71) Applicant: NICHIA CORPORATION, Anan (JP)

(72) Inventor: Shun Kitahama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 455 days.

(21) Appl. No.: 18/464,375

(22) Filed: Sep. 11, 2023

(65) Prior Publication Data

US 2024/0097075 A1 Mar. 21, 2024

(30) Foreign Application Priority Data

Sep. 21, 2022 (JP) ................................ 2022-150251

(51) Int. Cl.

*H10H 20/00* (2025.01)
*H10H 20/819* (2025.01)
*H10H 20/84* (2025.01)
*H10H 20/01* (2025.01)

(52) U.S. Cl.

CPC .......... *H10H 20/84* (2025.01); *H10H 20/819* (2025.01); *H10H 20/034* (2025.01)

(58) Field of Classification Search

None

See application file for complete search history.

(56) References Cited

U.S. PATENT DOCUMENTS

2005/0211989 A1* 9/2005 Horio .................. H10H 20/832 257/E33.068
2009/0179215 A1* 7/2009 Matsui ................. H10H 20/832 257/E21.294
2013/0207153 A1 8/2013 Kamiya et al.
2013/0234192 A1 9/2013 Kim et al.
2014/0117402 A1 5/2014 Wang et al.
2014/0131758 A1 5/2014 Shinohara
2016/0126423 A1 5/2016 Jung et al.
2017/0186914 A1* 6/2017 Kitahama ............ H10H 20/832

FOREIGN PATENT DOCUMENTS

JP 2013-168444 A 8/2013
JP 2014-500624 A 1/2014
JP 2014-086625 A 5/2014
JP 2014-099515 A 5/2014
JP 2016-092411 A 5/2016

* cited by examiner

*Primary Examiner* — Bradley Smith
(74) *Attorney, Agent, or Firm* — Foley & Lardner LLP

(57) ABSTRACT

A method for manufacturing a light-emitting element includes: preparing a semiconductor structure body that includes: an n-side layer, a p-side layer, and an active layer positioned between the n-side layer and the p-side layer, where the n-side layer includes a plurality of first regions arranged in a first direction in a top view, the first regions exposed from the active layer and the p-side layer; forming a first insulating film on the p-side layer, between the first regions; forming a second insulating film to continuously cover the first regions, the p-side layer, and the first insulating film; forming an n-side opening in the second insulating film by removing the second insulating film on the first regions and on the first insulating film; and forming an n-side electrode in the n-side opening, the n-side electrode contacting the first regions and the first insulating film.

17 Claims, 15 Drawing Sheets

11a
50(51)
41(41a)
40
13
20
10
12
11
100
Z
Y
X
W1
W2
W3

METHOD FOR MANUFACTURING LIGHT-EMITTING ELEMENT AND LIGHT-EMITTING ELEMENT

CROSS-REFERENCE TO RELATED APPLICATION

This application claims priority to Japanese Patent Application No. 2022-150251, filed on Sep. 21, 2022, the disclosure of which is hereby incorporated by reference in its entirety.

BACKGROUND

The disclosure relates to a method for manufacturing a light-emitting element and a light-emitting element.

Japanese Patent Publication No. 2014-99515 discusses a light-emitting element in which an n-side power supply part is located on a p-type semiconductor layer with a power supply insulating layer interposed.

SUMMARY

An object of the present disclosure is to provide a method for manufacturing a light-emitting element and a light-emitting element having high reliability.

In an embodiment of the disclosure, a method for manufacturing a light-emitting element includes preparing a semiconductor structure body, the semiconductor structure body including an n-side layer, a p-side layer, and an active layer positioned between the n-side layer and the p-side layer, the n-side layer including a plurality of first regions arranged in a first direction in a top view, the plurality of first regions exposed from the active layer and the p-side layer; forming a first insulating film on the p-side layer positioned between the plurality of first regions; forming a second insulating film to continuously cover the first regions, the p-side layer, and the first insulating film; forming an n-side opening in the second insulating film by removing the second insulating film on the first regions and on the first insulating film, the n-side opening being continuous in the first direction in the top view, the n-side opening exposing the first regions and the first insulating film from the second insulating film; and forming an n-side electrode in the n-side opening, the n-side electrode contacting the first regions and the first insulating film, a width in a second direction of the n-side opening being not more than a width of the first insulating film in the second direction in the top view, the second direction being orthogonal to the first direction.

In an embodiment of the disclosure, a light-emitting element includes a semiconductor structure body including an n-side layer, a p-side layer, and an active layer positioned between the n-side layer and the p-side layer, the n-side layer including a plurality of first regions arranged in a first direction in the top view, the plurality of first regions exposed from the active layer and the p-side layer; a first insulating film located on the p-side layer positioned between the plurality of first regions; a second insulating film located on the first regions, on the p-side layer, and on the first insulating film, the second insulating film including an n-side opening continuous in the first direction in the top view, the first regions and the first insulating film being exposed in the n-side opening; and an n-side electrode located in the n-side opening, the n-side electrode contacting the first regions and the first insulating film, a width in a second direction of the n-side opening being not more than a width of the first insulating film in the second direction in the top view, the second direction being orthogonal to the first direction.

According to the present disclosure, a method for manufacturing a light-emitting element and a light-emitting element having high reliability can be provided.

DETAILED DESCRIPTION

Figure 1:
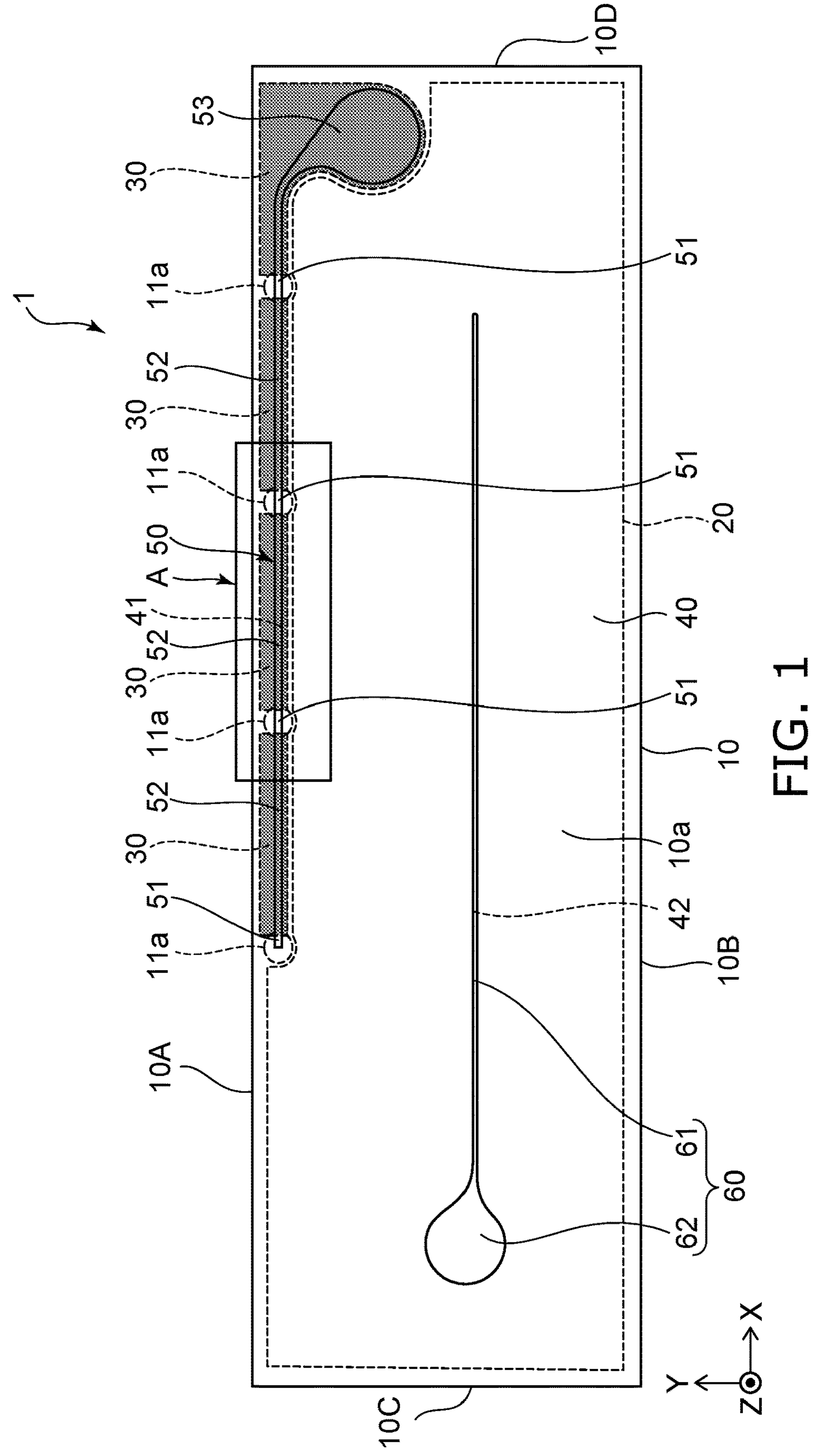
FIG. 1 is a schematic top view of a light-emitting element of a first embodiment.

Embodiments will now be described with reference to the drawings. Unless specifically stated, the dimensions, materials, shapes, relative arrangements, and the like of the components according to the embodiments are merely illustrative examples, and the scope of the invention is not intended to be limited to the described embodiments. The sizes, positional relationships, and the like shown in the drawings may be exaggerated for clarity of description. In the following description, the same names and reference numerals indicate the same or similar members, and a detailed description is omitted as appropriate. End views that show only cross sections may be used as cross-sectional views.

In the following description, terms that indicate specific directions or positions (e.g., "above," "below," and other terms including or related to such terms) may be used. Such terms, however, are used merely for better understanding of relative directions or positions when referring to the drawings. As long as the relationships are the same, the relative directions or positions according to terms such as "above," "below," etc., used when referring to the drawings may not have the same arrangements in drawings, actual products, and the like outside the disclosure. In the specification, when assuming that there are, for example, two members, the positional relationship expressed as "above (or below)" includes the case where the two members are in contact, and the case where the two members are not in contact so that one of the members is positioned above (or below) the other member. Unless specifically stated in the specification, a member covering a covered object includes the case where the member contacts the covered object and directly covers the covered object, and the case where the member indirectly covers the covered object without contacting the covered object. In the specification, a width of a member in a specific direction refers to the maximum value of the width in the specific direction.

Directions may be indicated by an X-axis, a Y-axis, and a Z-axis in the drawings below. The X-axis, the Y-axis, and the Z-axis are orthogonal to each other. For example, in the specification, a direction along the X-axis is taken as a first direction X, a direction along the Y-axis is taken as a second direction Y, and a direction along the Z-axis is taken as a third direction Z.

First Embodiment

A light-emitting element 1 of a first embodiment will now be described with reference to FIGS. 1 to 5. The light-emitting element 1 includes a semiconductor structure body 10, a first insulating film 30, a second insulating film 40, and an n-side electrode 50. Configurations will now be described in detail.

Semiconductor Structure Body

The semiconductor structure body 10 is made of a nitride semiconductor. In the specification, "nitride semiconductor" includes, for example, all compositions of semiconductors of the chemical formula $In_xAl_yGa_{1-x-y}N$ ($0 \leq x \leq 1$, $0 \leq y \leq 1$, and $x+y \leq 1$) for which the composition ratios x and y are changed within the ranges respectively. "Nitride semiconductor" further includes Group V elements other than N (nitrogen) in the chemical formula above, various elements added to control various properties such as the conductivity type, etc.

Figure 3:
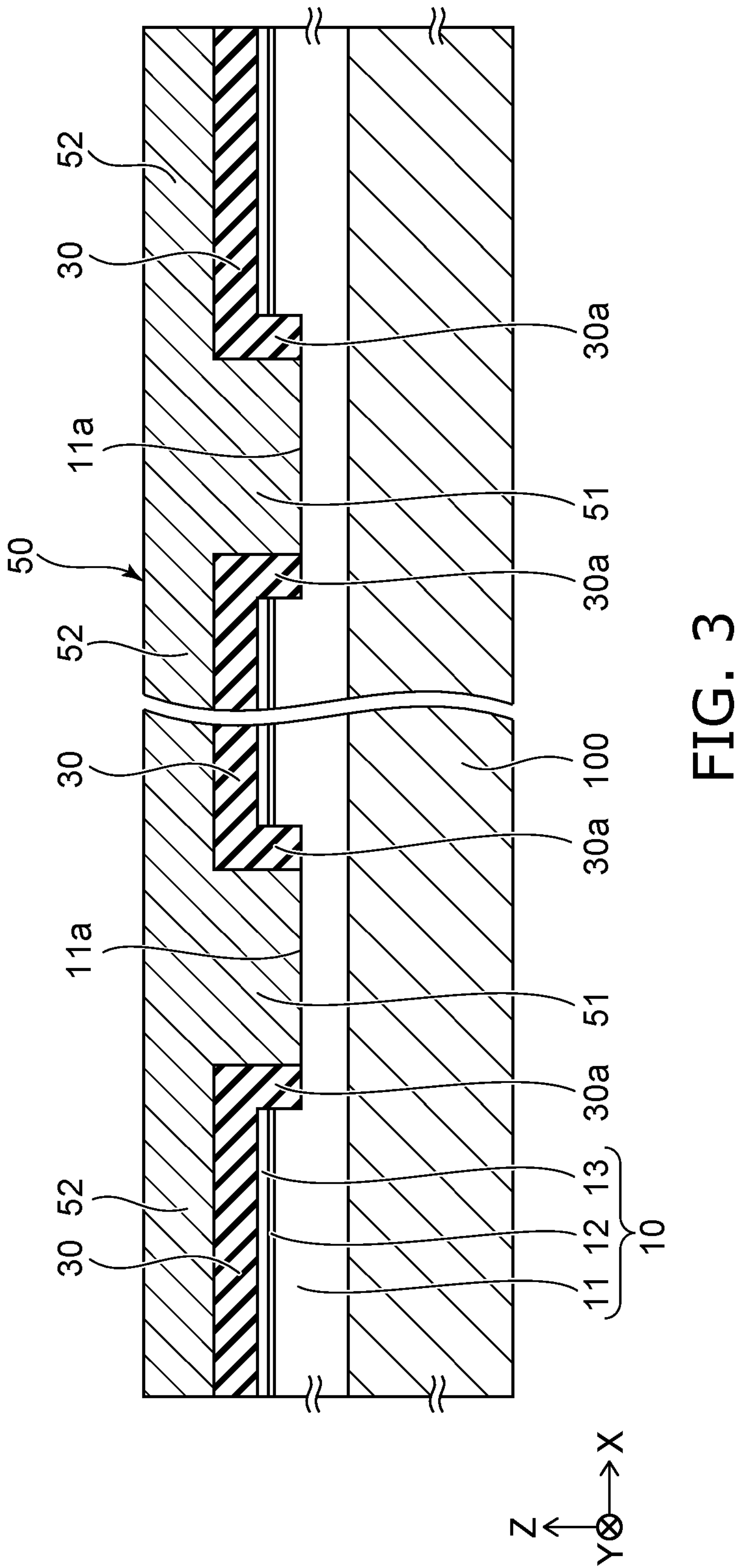
FIG. 3 is a schematic cross-sectional view along line III-III of FIG. 2.
Figure 4:
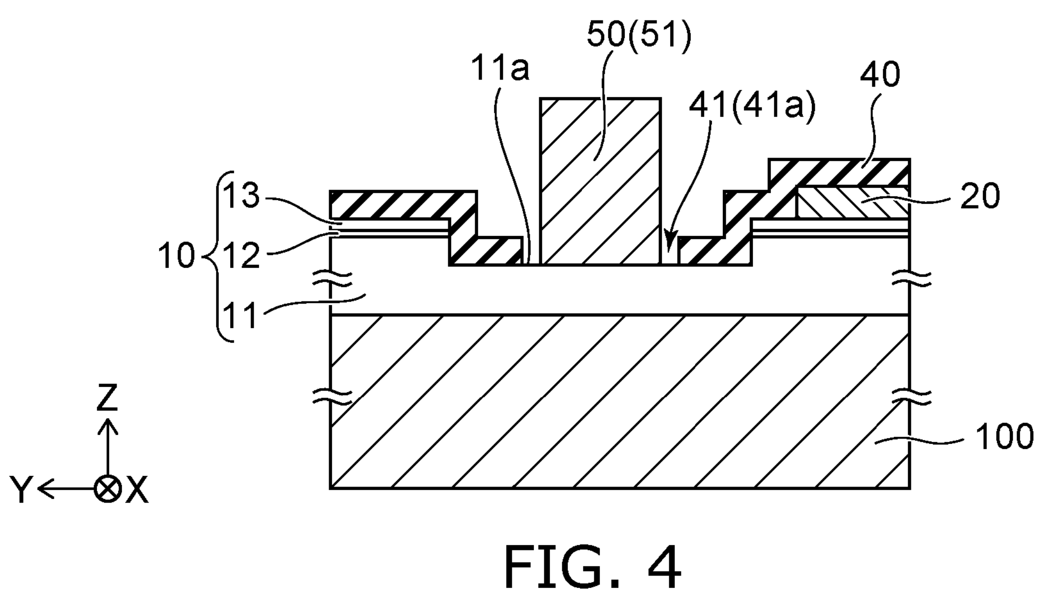
FIG. 4 is a schematic cross-sectional view along line IV-IV of FIG. 2.
Figure 5:
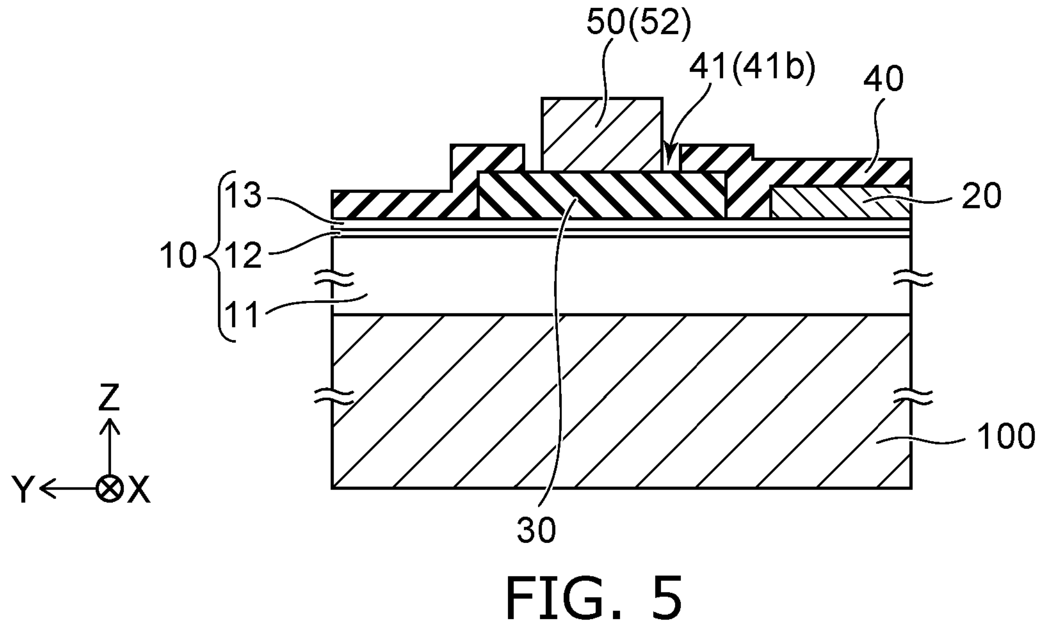
FIG. 5 is a schematic cross-sectional view along line V-V of FIG. 2.

As shown in FIGS. 3 to 5, the semiconductor structure body 10 includes an n-side layer 11, a p-side layer 13, and an active layer 12 positioned between the n-side layer 11 and the p-side layer 13 in the third direction Z. The active layer 12 is a light-emitting layer that emits light and has, for example, a MQW (Multiple Quantum well) structure including multiple barrier layers and multiple well layers. For example, the active layer 12 emits light having a peak wavelength of not less than 210 nm and not more than 580 nm. The n-side layer 11 includes a semiconductor layer including an n-type impurity. The p-side layer 13 includes a semiconductor layer including a p-type impurity. The light that is emitted by the active layer 12 is extracted to the outside mainly from a light-emitting surface 10*a* of the light-emitting element 1 shown in FIG. 1.

The light-emitting element 1 can further include a substrate 100 that supports the semiconductor structure body 10. For example, the substrate 100 is a substrate for growing the semiconductor structure body 10. The substrate 100 can include, for example, an insulating substrate of sapphire or spinel ($MgAl_2O_4$) having one of a C-plane, an R-plane, or an A-plane as a major surface. A conductive substrate of SiC (including 6H, 4H, and 3C), ZnS, ZnO, GaAs, Si, etc., may be used as the substrate 100. The substrate 100 may not be included in the light-emitting element 1.

The shape of the semiconductor structure body 10 in the top view is, for example, rectangular. According to the first embodiment, the shape of the semiconductor structure body 10 in the top view is rectangular. As shown in FIG. 1, the semiconductor structure body 10 includes a first outer edge 10A, a second outer edge 10B, a third outer edge 10C, and a fourth outer edge 10D in the top view. The first outer edge 10A and the second outer edge 10B extend in the first direction X, and the third outer edge 10C and the fourth outer edge 10D extend in the second direction Y. In the top view, the first outer edge 10A and the second outer edge 10B are separated from each other in the second direction Y, and the third outer edge 10C and the fourth outer edge 10D are separated from each other in the first direction X. In the example shown in FIG. 1, the lengths of the first and second outer edges 10A and 10B are greater than the lengths of the third and fourth outer edges 10C and 10D. The outer perimeter portion of the semiconductor structure body 10 includes the n-side layer 11, the active layer 12 located on the n-side layer 11, and the p-side layer 13 located on the active layer 12. The first insulating film 30 is located on the p-side layer 13 at the outer perimeter portion of the semiconductor structure body 10. The outer perimeter portion of the semiconductor structure body 10 refers to the area within 20 μm inward from the first to fourth outer edges 10A to 10D of the semiconductor structure body 10.

Figure 2:
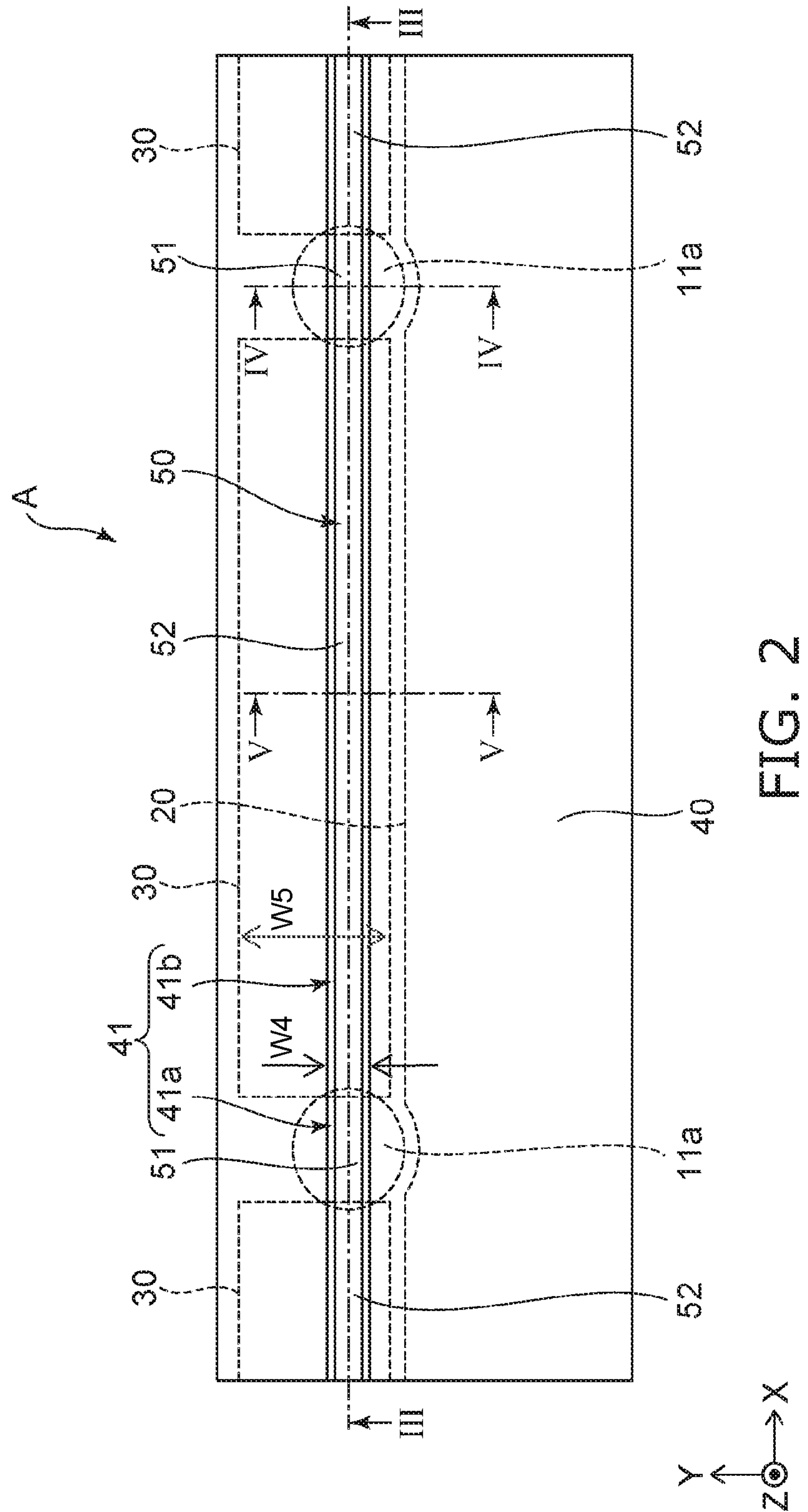
FIG. 2 is an enlarged top view of portion A of FIG. 1.

As shown in FIGS. 3 to 5, the n-side layer 11 includes a first region 11*a* that is exposed from the active layer 12 and the p-side layer 13. At the surface of the semiconductor structure body 10 at the side opposite to the surface contacting the substrate 100, the region where the n-side layer 11 is exposed from the active layer 12 and the p-side layer 13 is only the first region 11*a*. As shown in FIGS. 1 and 2, the multiple first regions 11*a* are arranged to be separated from each other in the first direction X in the top view. For example, the multiple first regions 11*a* are arranged in the first direction X at positions more proximate to the first outer edge 10A than the second outer edge 10B in the top view. The first region 11*a* is, for example, circular in the top view. The first region 11*a* may be a quadrilateral or a polygon having five or more sides in the top view.

First Insulating Film

As shown in FIGS. 2 and 3, the first insulating film 30 is located on the p-side layer 13 positioned between the multiple first regions 11*a* arranged in the first direction X. The first insulating film 30 extends in the first direction X between the two first regions 11*a* next to each other in the first direction X. The first insulating film 30 covers the upper surface of the p-side layer 13.

As shown in FIG. 3, an end portion 30*a* in the first direction X of the first insulating film 30 covers the lateral surface of the p-side layer 13, the lateral surface of the active layer 12, and the lateral surface of the n-side layer 11 that are continuous between the first region 11*a* and the upper surface of the p-side layer 13.

The first insulating film 30 is transmissive to the light emitted by the active layer 12. The first insulating film 30 has a transmittance of not less than 60%, and favorably not less than 70% for the light emitted by the active layer 12. The first insulating film 30 is, for example, a silicon nitride film. A silicon oxide film may be used as the first insulating film 30. A silicon nitride film absorbs the light of the wavelength range described above emitted by the active layer 12 more easily than a silicon oxide film. Therefore, when a silicon nitride film is used as the first insulating film 30, it is favorable for the width, in the second direction Y, of the first insulating film 30 positioned between the multiple first regions 11*a* arranged in the first direction X to be less than the width, in the second direction Y, of the first region 11*a* in the top view. The absorption region of the light by the first insulating film 30 in the light-emitting surface 10*a* of the light-emitting element 1 can be reduced thereby. An aluminum oxide film, a titanium oxide film, etc., also can be used as the first insulating film 30.

Second Insulating Film

The second insulating film 40 is located on the first region 11*a*, on the p-side layer 13, and on the first insulating film 30. As shown in FIG. 4, the second insulating film 40 covers parts of the lateral surface of the p-side layer 13, the lateral surface of the active layer 12, and the lateral surface of the n-side layer 11 continuous between the first region 11*a* and the upper surface of the p-side layer 13 at which the first insulating film 30 is not located. As shown in FIG. 5, the second insulating film 40 also covers the lateral surface of the first insulating film 30.

As shown in FIG. 2, the second insulating film 40 includes an n-side opening 41 that is continuous in the first direction X in the top view. The first region 11*a* and the first insulating film 30 are exposed from the second insulating film 40 in the n-side opening 41.

The width W4, in the second direction Y, of the n-side opening 41 is not more than the width W5, in the second direction Y, of the first insulating film 30 in the top view. In the example shown in FIG. 2, the width W4, in the second direction Y, of the n-side opening 41 is less than the width W5, in the second direction Y, of the first insulating film 30.

The n-side opening 41 includes a first opening 41*a* that is positioned on the first region 11*a*, and a second opening 41*b* that is positioned on the first insulating film 30. The first opening 41*a* and the second opening 41*b* are continuous in the first direction X. In the example shown in FIG. 2, the width, in the second direction Y, of the first opening 41*a* is equal to the width, in the second direction Y, of the second opening 41*b*.

The second insulating film 40 is transmissive to the light emitted by the active layer 12. The second insulating film 40 has a transmittance of not less than 60%, and favorably not less than 80% for the light emitted by the active layer 12. The second insulating film 40 is, for example, a silicon oxynitride film. A silicon oxide film, an aluminum oxide film, a titanium oxide film, etc., also can be used as the second insulating film 40.

N-Side Electrode

The n-side electrode 50 is located in the n-side opening 41 and contacts the first region 11*a* and the first insulating film 30. As shown in FIGS. 3 and 4, the n-side electrode 50 includes a first part 51 that is positioned in the first opening 41*a* of the n-side opening 41. The n-side electrode 50 is electrically connected with the n-side layer 11 by the first part 51 contacting the first region 11*a*.

As shown in FIG. 5, the n-side electrode 50 also includes a second part 52 that is positioned in the second opening 41*b* of the n-side opening 41. The first part 51 and the second part 52 are continuous in the first direction X. The second part 52 is positioned on the first insulating film 30. The first insulating film 30 is located between the n-side electrode 50 and the p-side layer 13 and can increase reliability because leakage current does not easily occur between the n-side electrode 50 and the p-side layer 13. It is favorable for the thickness of the first insulating film 30 to be greater than the thickness of the second insulating film 40 so that leakage current between the n-side electrode 50 and the p-side layer 13 does not easily occur. Here, the thickness of the first insulating film 30 refers to the thickness in the direction of the shortest distance between the upper surface of the p-side layer 13 and the lower surface of the n-side electrode 50. The thickness of the second insulating film 40 refers to the shortest distance between the lower surface positioned at the p-side layer 13 side and the upper surface positioned at the side opposite to the lower surface in the third direction.

As shown in FIG. 1, the n-side electrode 50 further includes a third part 53. The third part 53 is continuous with one end portion of the second part 52 in the first direction X. For example, the third part 53 is positioned proximate to the corner portion between the first outer edge 10A and the fourth outer edge 10D of the semiconductor structure body 10 in the top view.

The width, in the second direction Y, of the third part 53 is greater than the width, in the second direction Y, of the first part 51 and the width, in the second direction Y, of the second part 52. For example, a conductive wire is connected to the third part 53, and the n-side electrode 50 is electrically connected with an external circuit via the conductive wire.

In FIG. 1, the first insulating film 30 is illustrated by cross hatching. The first insulating film 30 also is located under the third part 53. The reliability can be increased because the third part 53 is located on the p-side layer 13 with the first insulating film 30 interposed so that leakage current between the third part 53 and the p-side layer 13 does not easily occur.

P-Side Electrode

As shown in FIG. 1, the light-emitting element 1 further includes a p-side electrode 60. The p-side electrode 60 is located in a p-side opening 42 formed in the second insulating film 40 positioned on the p-side layer 13, and is electrically connected to the p-side layer 13. For example, the p-side electrode 60 includes a p-side extension part 61 that extends in the first direction X, and a p-side pad part 62 continuous with one end portion of the p-side extension part 61 in the first direction X. The width, in the second direction Y, of the p-side pad part 62 is greater than the width, in the second direction Y, of the p-side extension part 61. For example, a conductive wire is connected to the p-side pad part 62, and the p-side electrode 60 is electrically connected with an external circuit via the conductive wire.

A metal material such as Rh, Pt, Au, Cu, etc., can be used as the materials of the n-side electrode 50 and the p-side electrode 60.

Light-Transmitting Conductive Layer

As shown in FIGS. 4 and 5, the light-emitting element 1 can further include a light-transmitting conductive layer 20 located on the p-side layer 13. The light-transmitting conductive layer 20 is covered with the second insulating film 40.

The light-transmitting conductive layer 20 contacts the upper surface of the p-side layer 13. The p-side electrode 60 is located on the light-transmitting conductive layer 20 and contacts the upper surface of the light-transmitting conductive layer 20. Accordingly, the p-side electrode 60 is electrically connected with the p-side layer 13 via the light-transmitting conductive layer 20. The light-transmitting conductive layer 20 has the function of diffusing, in the planar direction of the p-side layer 13, the current supplied via the p-side electrode 60. Uneven luminance in the light-emitting surface 10*a* of the light-emitting element 1 can be reduced thereby. The light-transmitting conductive layer 20 is transmissive to the light emitted by the active layer 12. The light-transmitting conductive layer 20 has a transmittance of not less than 60%, and favorably not less than 70% for the light emitted by the active layer 12.

For example, ITO (Indium Tin Oxide), ZIO (Zinc Indium Oxide), ZnO, $In_2O_3$, etc., can be used as the material of the light-transmitting conductive layer 20. The thickness of the light-transmitting conductive layer 20 can be, for example, not less than 30 nm and not more than 200 nm.

The outer edge of the light-transmitting conductive layer 20 positioned under the second insulating film 40 is shown by a broken line in FIG. 1. In the example shown in FIG. 1, the light-transmitting conductive layer 20 is located at a position at which the light-transmitting conductive layer 20 does not overlap the first insulating film 30 in the top view. The first insulating film 30 contacts the upper surface of the p-side layer 13 directly under the n-side electrode 50. Because the light-transmitting conductive layer 20 is not located directly under the n-side electrode 50, leakage current between the n-side electrode 50 and the light-transmitting conductive layer 20 does not easily occur.

The light-transmitting conductive layer 20 may be located in a position at which the light-transmitting conductive layer 20 overlaps the first insulating film 30 in the top view. In such a case, the current can be diffused to the p-side layer 13 directly under the first insulating film 30, and leakage current between the n-side electrode 50 and the p-side layer 13 does not easily occur because the first insulating film 30 is located between the light-transmitting conductive layer 20 and the n-side electrode 50.

A method for manufacturing the light-emitting element 1 of the first embodiment will now be described with reference to FIGS. 6 to 10. The region shown in FIGS. 6 to 10 corresponds to the region shown in FIG. 2. The members included in the light-emitting element 1 are as described above, and a detailed description may be omitted as appropriate.

Process of Preparing Semiconductor Structure Body

A method for manufacturing the light-emitting element 1 includes a process of preparing the semiconductor structure body 10. The semiconductor structure body 10 includes the n-side layer 11, the p-side layer 13, and the active layer 12 positioned between the n-side layer 11 and the p-side layer 13. The process of preparing the semiconductor structure body 10 includes forming the n-side layer 11, the active layer 12, and the p-side layer 13 in this order on the substrate 100 by, for example, MOCVD (Metal Organic Chemical Vapor Deposition).

Figure 6:
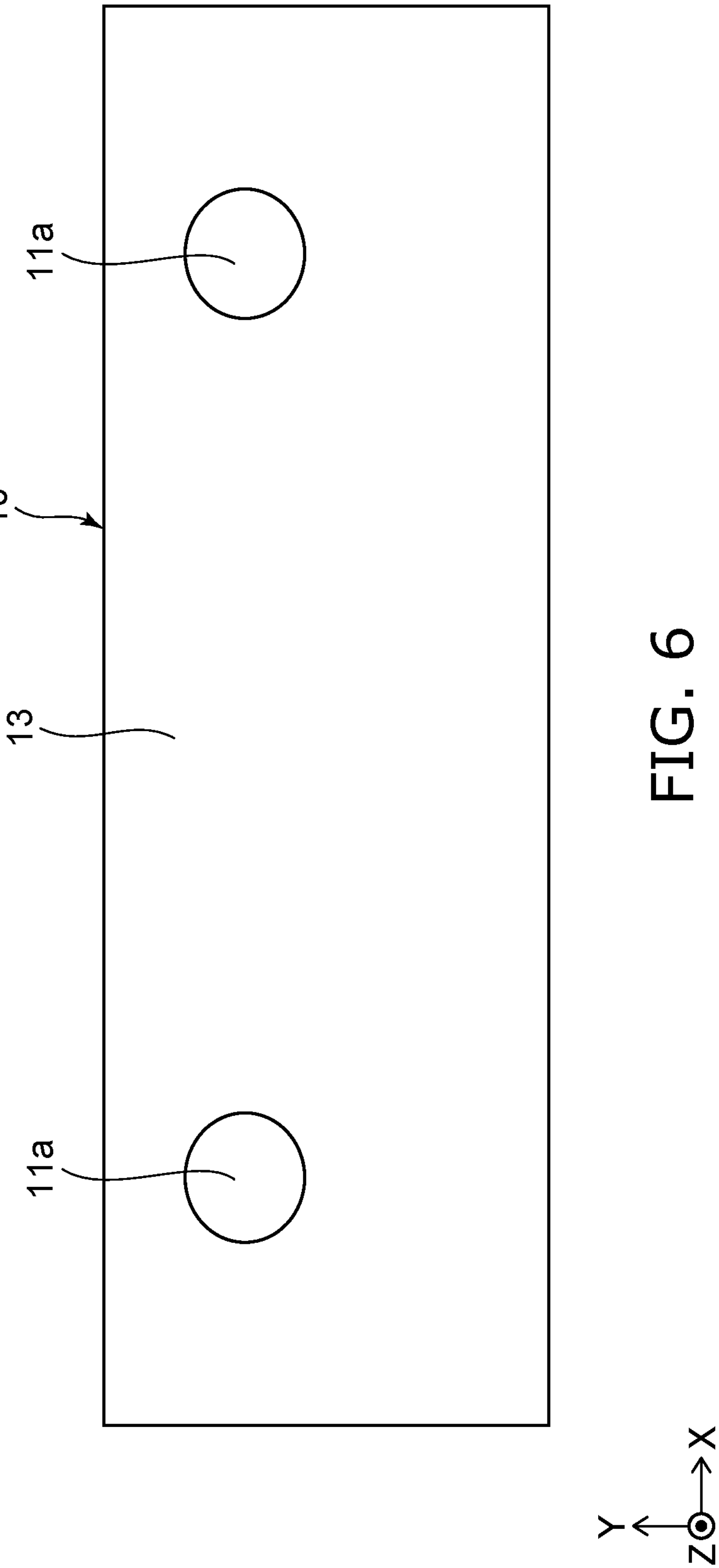
FIGS. 6 to 10 are schematic top views for describing processes of a method for manufacturing the light-emitting element of the first embodiment.

As shown in FIG. 6, the n-side layer 11 includes the first regions 11*a* that are exposed from the active layer 12 and the p-side layer 13. The multiple first regions 11*a* are arranged to be separated from each other in the first direction X in the top view. The first region 11*a* can be formed by removing the p-side layer 13 and the active layer 12. For example, RIE (Reactive Ion Etching) or the like can be used to remove the p-side layer 13 and the active layer 12.

Figure 7:
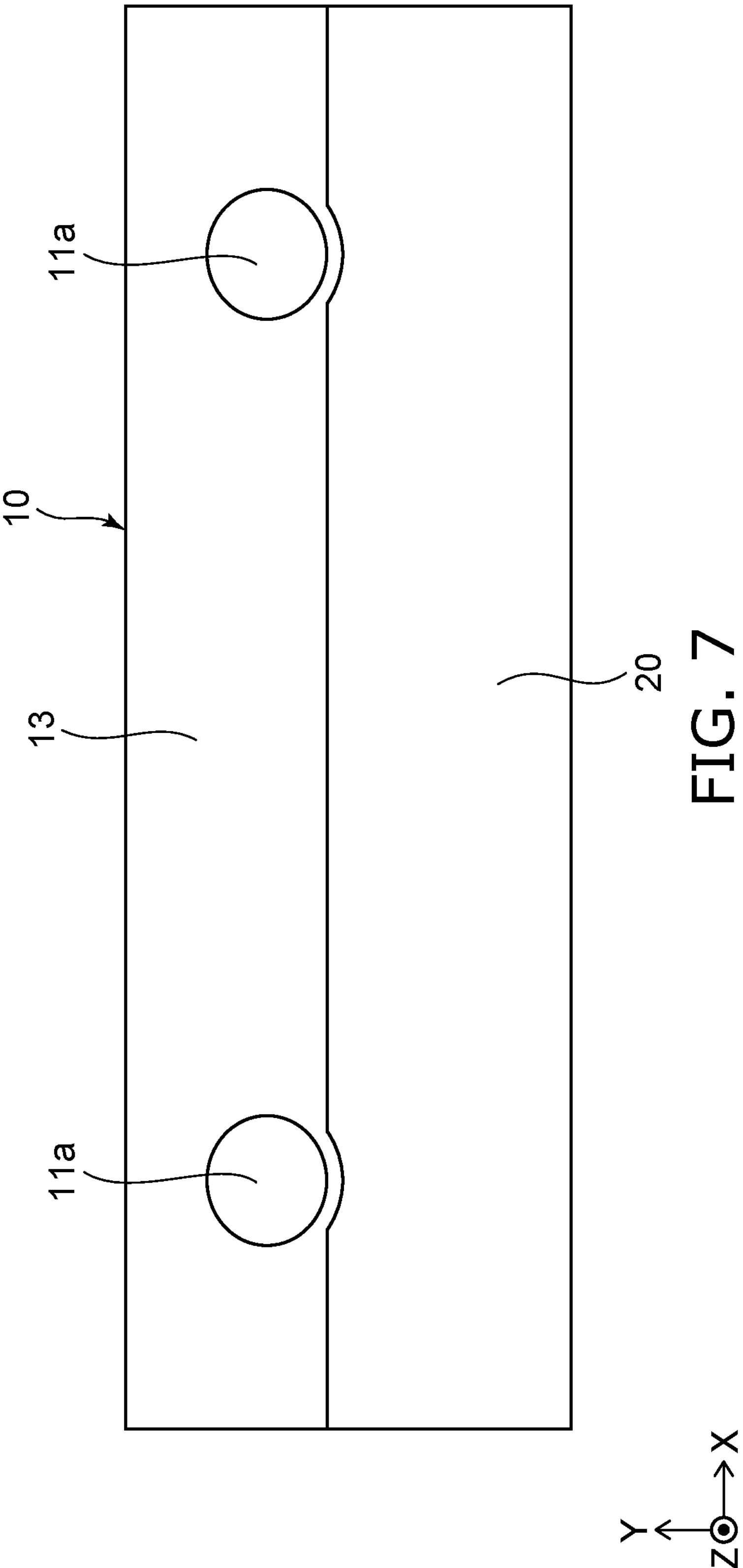

The process of preparing the semiconductor structure body 10 includes forming the light-transmitting conductive layer 20. As shown in FIG. 7, the light-transmitting conductive layer 20 is formed in a region on the p-side layer 13 other than the region between the first regions 11*a* in the top view. The light-transmitting conductive layer 20 is not located between the first regions 11*a* arranged in the first direction X, that is, the light-transmitting conductive layer 20 is not located in the regions at which the n-side electrodes 50 are provided in a process described below. The light-transmitting conductive layer 20 may not be formed.

For example, the light-transmitting conductive layer 20 is formed over the entire surface of the upper surface of the semiconductor structure body 10 including the first regions 11*a* and the upper surface of the p-side layer 13, after which etching using a resist mask is performed to remove the light-transmitting conductive layer 20 on the first regions 11*a* and on the p-side layer 13 between the first regions 11*a*. For example, wet etching is performed to remove the light-transmitting conductive layer 20. For example, the wet etching is performed using hydrochloric acid, nitric acid, a mixed liquid of hydrochloric acid and nitric acid, etc.

The case where the light-transmitting conductive layer 20 is formed is described below.

Process of Forming First Insulating Film

Figure 8:
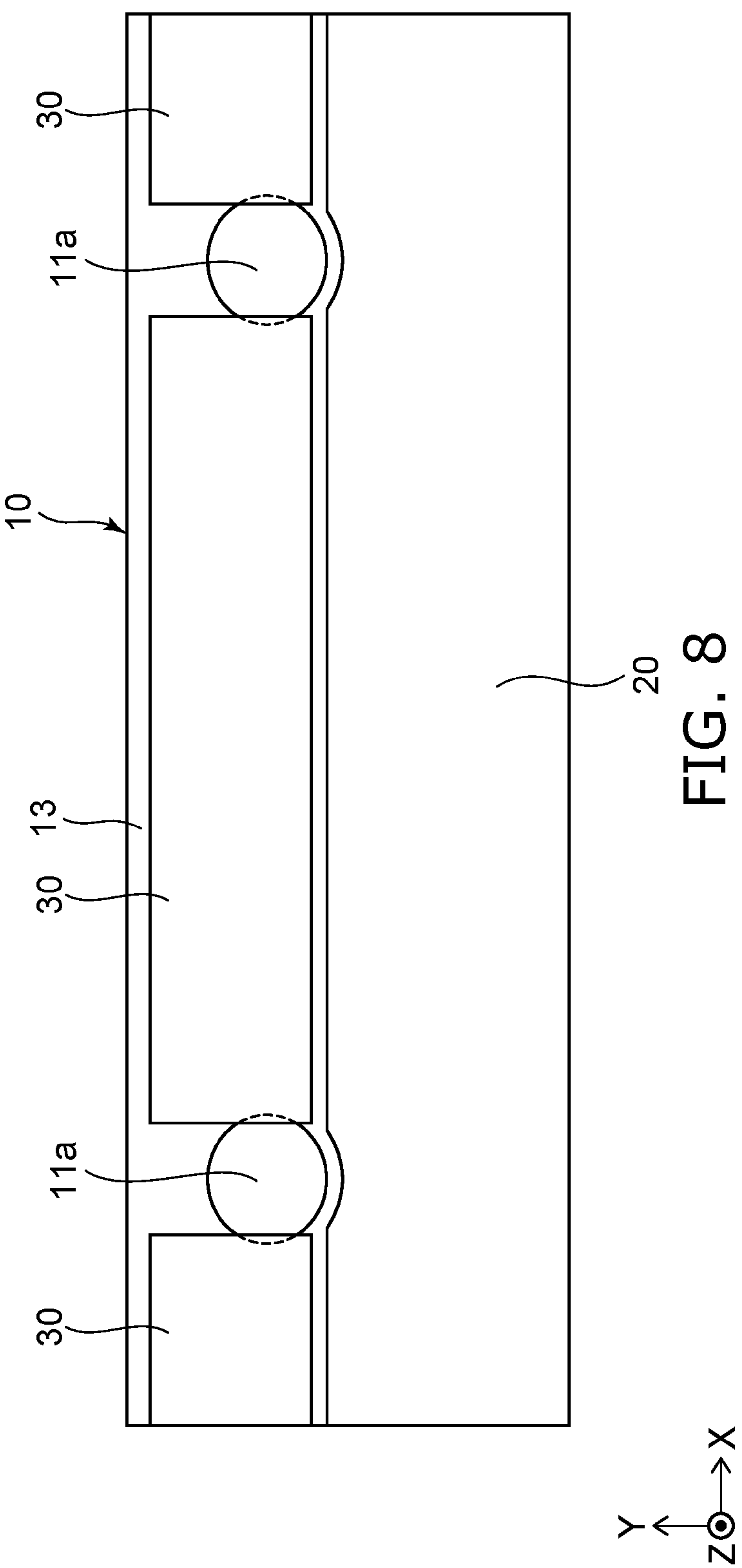

The method for manufacturing the light-emitting element 1 includes, after the light-transmitting conductive layer 20 is formed, a process of forming the first insulating film 30. As shown in FIG. 8, the first insulating film 30 is formed on the p-side layer 13 positioned between the multiple first regions 11*a* arranged in the first direction X.

For example, a silicon nitride film is formed as the first insulating film 30. For example, the first insulating film 30 is formed by sputtering or CVD after forming a resist mask that exposes the upper surface of the p-side layer 13 between the multiple first regions 11*a*. Subsequently, the resist mask and the first insulating film 30 formed on the resist mask are removed together by removing the resist mask. The first insulating film 30 that is positioned on the p-side layer 13 between the multiple first regions 11*a* can be formed thereby.

In the example shown in FIG. 8, the width, in the second direction Y, of the first insulating film 30 is less than the width, in the second direction Y, of the first region 11*a* in the top view. As described above, the absorption region of the light by the first insulating film 30 in the light-emitting surface 10*a* of the light-emitting element 1 can be reduced thereby.

After the process of forming the first insulating film 30, it is favorable for the method for manufacturing the light-emitting element 1 to further include the process of heat-treating the semiconductor structure body 10. It is considered that the heat treatment of the semiconductor structure body 10 causes desorption from the p-side layer 13 of hydrogen incorporated into the p-side layer 13 due to the raw material gas used when forming the p-side layer 13. The desorption of the hydrogen from the p-side layer 13 activates the p-side layer 13 and reduces the electrical resistance of the p-side layer 13, and the luminous efficiency of the light-emitting element 1 can be increased thereby.

The light-transmitting conductive layer 20 does not exist directly under the first insulating film 30, and the first insulating film 30 and the p-side layer 13 contact in the region between the first regions 11*a*. In the heat treatment process described above, the hydrogen does not easily diffuse from the p-side layer 13 into the first insulating film 30, and the p-side layer 13 is difficult to activate in the region contacting the first insulating film 30. Accordingly, the region of the p-side layer 13 between the first regions 11*a* has a higher electrical resistance than the region of the p-side layer 13 at which the light-transmitting conductive layer 20 is formed. The region between the first regions 11*a* is the region at which the n-side electrode 50 described below is formed, and leakage current between the n-side electrode 50 and the p-side layer 13 does not easily occur because the electrical resistance of the p-side layer 13 between the first regions 11*a* is high. The reliability of the light-emitting element 1 can be increased thereby.

By forming the first insulating film 30 only on the p-side layer 13 positioned between the multiple first regions 11*a*, the electrical resistance of the region of the p-side layer 13 other than the region of the p-side layer 13 under the n-side electrode 50 can be reduced by the heat treatment described above.

Process of Forming Second Insulating Film

The method for manufacturing the light-emitting element 1 includes, after the process of forming the first insulating film 30, a process of forming the second insulating film 40. When the process of heat-treating the semiconductor structure body 10 is performed, the second insulating film 40 is formed after the process of heat-treating the semiconductor structure body 10.

Figure 9:
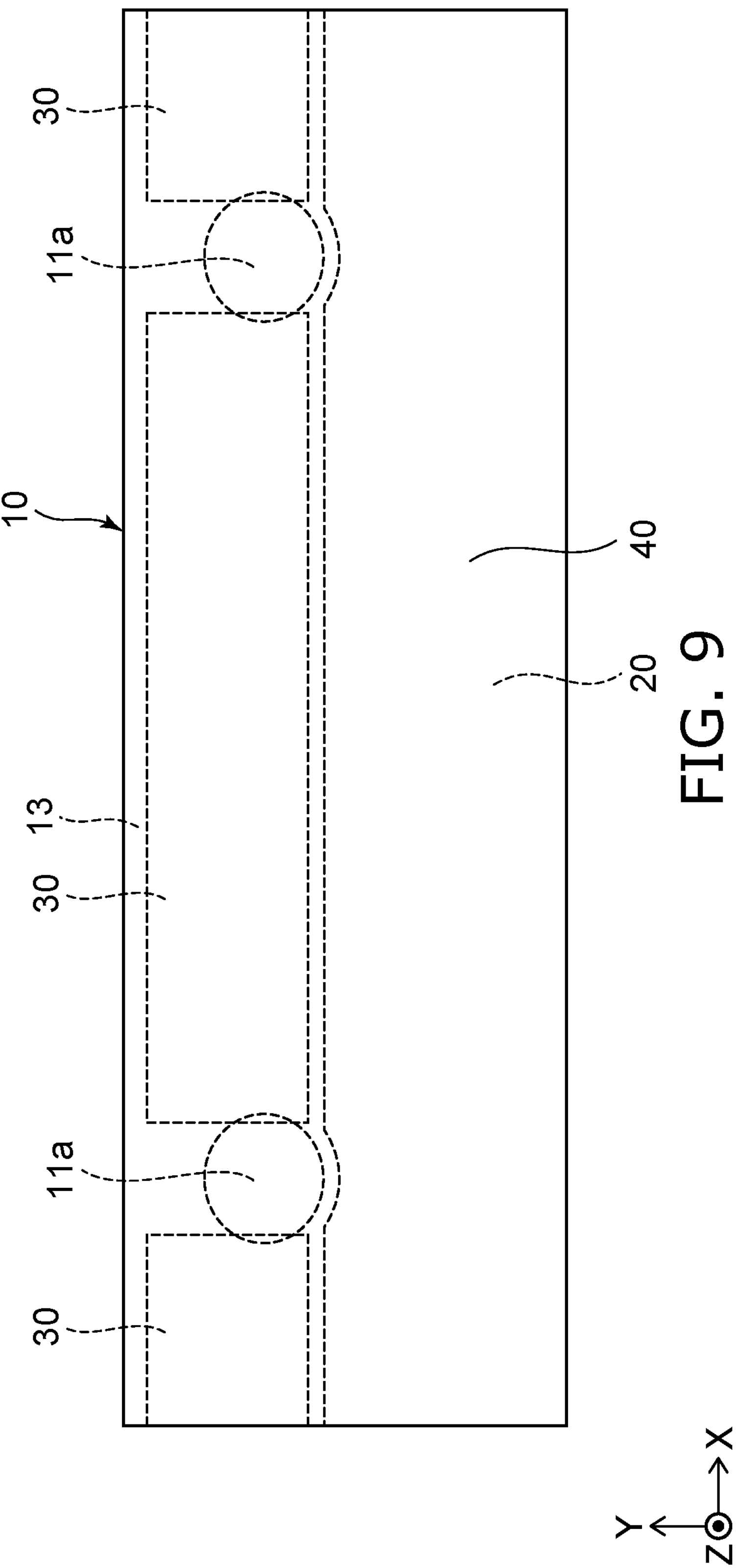

As shown in FIG. 9, the second insulating film 40 continuously covers the first regions 11*a*, the p-side layer 13, the light-transmitting conductive layer 20, and the first insulating film 30. For example, the second insulating film 40 is formed by sputtering or CVD.

Process of Forming n-Side Opening

Figure 10:
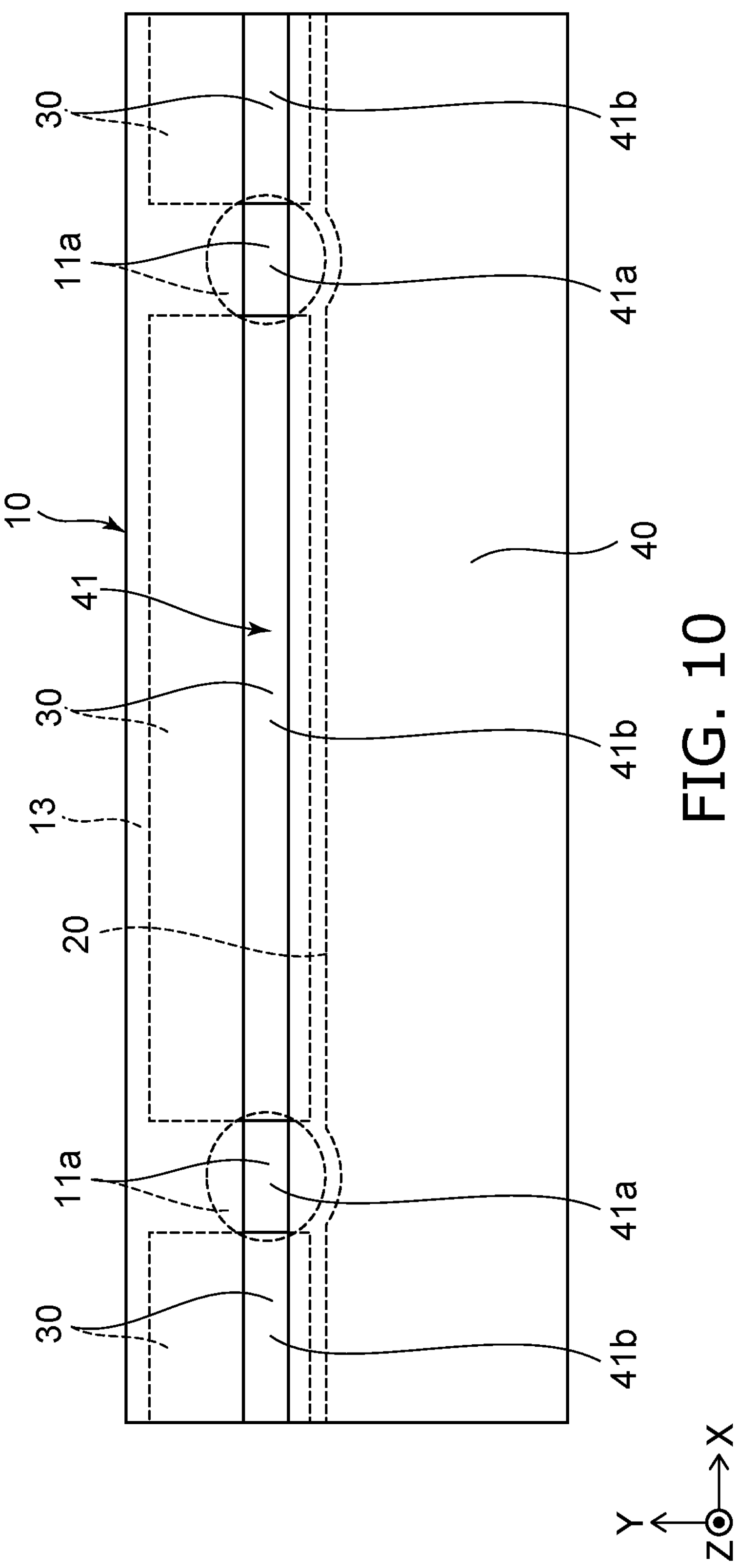

The method for manufacturing the light-emitting element 1 includes a process of forming the n-side opening 41 in the second insulating film 40. The second insulating film 40 that is on the first regions 11*a* and on the first insulating film 30 is removed. Accordingly, as shown in FIG. 10, the n-side opening 41 that is continuous in the first direction X in the top view and exposes the first regions 11*a* and the first insulating film 30 from under the second insulating film 40 is formed.

For example, the n-side opening 41 is formed by forming a resist mask on the second insulating film 40 and by removing the second insulating film 40 by etching. In the process of forming the n-side opening 41 in the second insulating film 40, it is favorable to remove the second insulating film 40 by using an etching condition so that the etching rate of the second insulating film 40 is greater than the etching rate of the first insulating film 30. For example, when the first insulating film 30 is a silicon nitride film and the second insulating film 40 is a silicon oxynitride film, the second insulating film 40 is removed by wet etching using BHF (Buffered Hydrofluoric Acid). At this time, the etching rate of the first insulating film 30 is not more than 1/10 of the etching rate of the second insulating film 40. The reduction of the thickness of the first insulating film 30 when forming the n-side opening 41 can be reduced thereby, and leakage current between the n-side electrode 50 and the p-side layer 13 does not easily occur.

It is favorable to set the thickness of the first insulating film 30 to be greater than the thickness of the second insulating film 40 in the process of forming the first insulating film 30 so that the thick first insulating film 30 remains on the p-side layer 13 even when the first insulating film 30 is etched in the process of forming the n-side opening 41. For example, the thickness of the first insulating film 30 can be not less than 50 nm and not more than 1000 nm, and favorably not less than 200 nm and not more than 400 nm. For example, the thickness of the second insulating film 40 can be not less than 10 nm and not more than 300 nm, and favorably not less than 50 nm but less than 200 nm.

The n-side opening 41 includes the first opening 41*a* that is positioned on the first region 11*a*, and the second opening 41*b* that is positioned on the first insulating film 30. The first opening 41*a* and the second opening 41*b* are continuous in the first direction X.

The width, in the second direction Y, of the n-side opening 41 positioned on the first insulating film 30 is not more than the width, in the second direction Y, of the first insulating film 30 in top view. Accordingly, the n-side electrode 50 that is formed in the n-side opening 41 in a subsequent process does not easily jut from the first insulating film 30 in the second direction Y. As a result, the n-side electrode 50 and the p-side layer 13 are not easily shorted because the n-side electrode 50 and the p-side layer 13 are not in contact.

According to the embodiment, the n-side opening 41 that is continuous in the first direction X in the top view is formed to expose the first regions 11*a* and the first insulating film 30 from under the second insulating film 40. In other words, the n-side opening 41 is formed to be continuous between the multiple first regions 11*a*. Accordingly, the n-side opening 41 can be formed more easily than when multiple n-side openings are partially formed according to the positions of the multiple first regions 11*a*. In particular, when the opening is formed by exposing and developing a resist mask, it is easier to form an opening that is continuous in the first direction X than to form relatively small multiple openings in the resist mask. The n-side opening 41 is formed to be continuous between the multiple first regions 11*a* by removing, by etching, the second insulating film 40 exposed in the opening formed in the resist mask to be continuous in the first direction X. The p-side layer 13 is not exposed in the n-side opening 41 because the first insulating film 30 is formed on the p-side layer 13 between the multiple first regions 11*a*.

Process of Forming n-Side Electrode

The method for manufacturing the light-emitting element 1 includes, after the process of forming the n-side opening 41, a process of forming the n-side electrode 50 in the n-side opening 41. As shown in FIGS. 3 to 5 above, the n-side electrode 50 contacts the first insulating film 30 and the first regions 11*a* in the n-side opening 41. For example, the n-side electrode 50 can be formed by sputtering, vapor deposition, etc.

The method for manufacturing the light-emitting element 1 includes a process of forming the p-side electrode 60. For example, the p-side opening 42 also is formed in the second insulating film 40 simultaneously with the n-side opening 41 in the process of forming the n-side opening 41 in the second insulating film 40 described above. The light-transmitting conductive layer 20 is exposed from the second insulating film 40 in the p-side opening 42. The p-side electrode 60 is formed on the light-transmitting conductive layer 20 positioned in the p-side opening 42. Accordingly, the p-side electrode 60 is electrically connected with the p-side layer 13 via the light-transmitting conductive layer 20.

By the processes described above, for example, a wafer is formed in which multiple light-emitting element regions are formed on one substrate, after which the wafer is subdivided to be singulated into the multiple light-emitting elements 1.

Figures 11, 12:
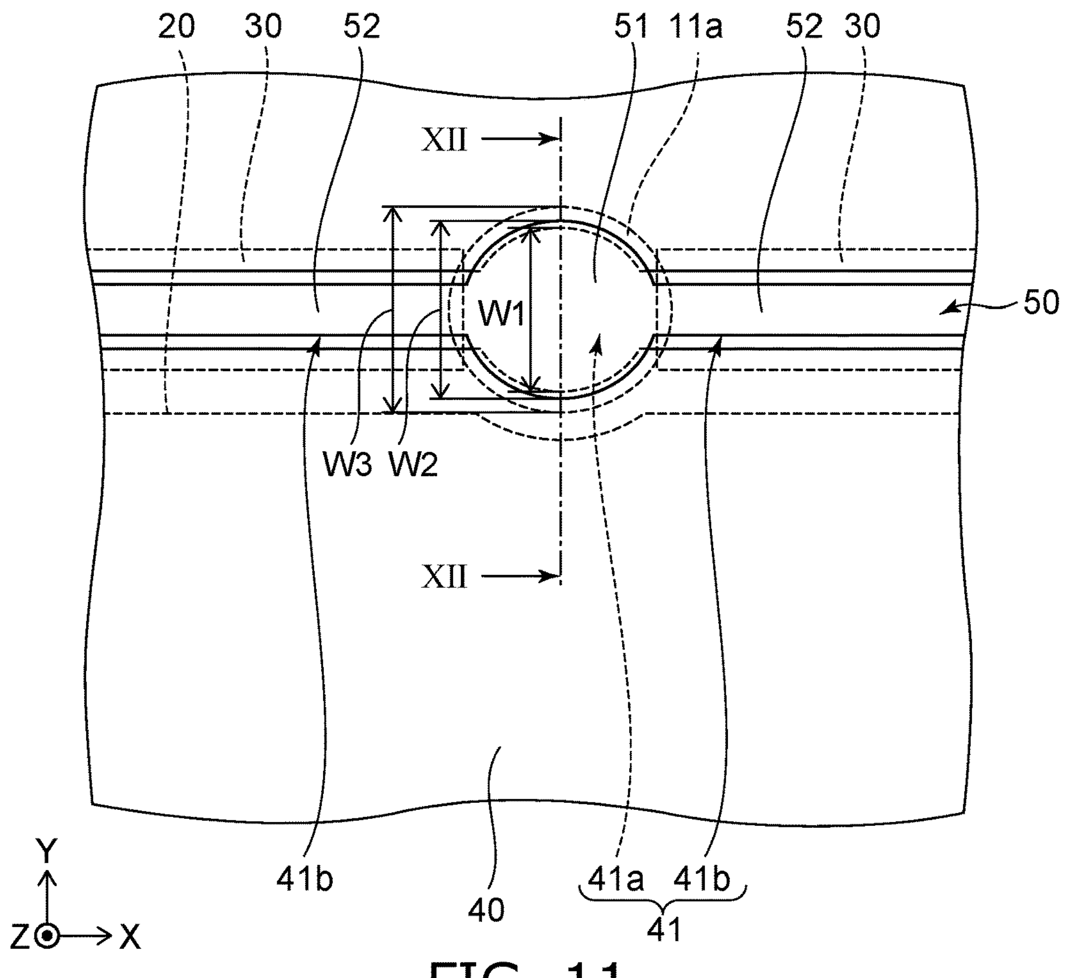
FIG. 11 is a schematic top view of a portion of a light-emitting element according to a first modification of the first embodiment.
FIG. 12 is a schematic cross-sectional view along line XII-XII of FIG. 11.

FIG. 11 is a schematic top view of one portion of a light-emitting element according to a first modification of the first embodiment. FIG. 12 is a schematic cross-sectional view along line XII-XII of FIG. 11.

According to the first modification, the width, in the second direction Y, of the first opening 41*a* of the n-side opening 41 is greater than the width, in the second direction Y, of the second opening 41*b* of the n-side opening 41 in the top view. The width, in the second direction Y, of the first part 51 of the n-side electrode 50 is greater than the width, in the second direction Y, of the second part 52 of the n-side electrode 50 in the top view. The first part 51 overlaps the outer edge of the first opening 41*a* in the top view. Accordingly, compared to when the width, in the second direction Y, of the first part 51 is not more than the width, in the second direction Y, of the second part 52, the contact area between the n-side electrode 50 and the first region 11*a* can be increased, and the contact resistance between the n-side electrode 50 and the first region 11*a* can be reduced. Because the second part 52 has a smaller width, in the second direction Y, than the first part 51 and is positioned on the p-side layer 13 between the multiple first regions 11*a*, the optical absorption by the n-side electrode 50 on the p-side layer 13 between the multiple first regions 11*a* can be reduced.

In the top view, a width W2, in the second direction Y, of the first part 51 of the n-side electrode 50 is not less than a width W1, in the second direction Y, of the first opening 41*a* of the n-side opening 41 and not more than a width W3, in the second direction Y, of the first region 11*a*. The first part 51 of the n-side electrode 50 does not overlap the outer edge of the first region 11*a* in the top view.

By setting the width W2 of the first part 51 to be not less than the width W1 of the first opening 41*a*, the first region 11*a* that is exposed in the first opening 41*a* can be covered with the first part 51 as shown in FIG. 12. The first region 11*a* is not exposed from the first part 51 in the first opening 41*a*. The first region 11*a* can be protected thereby, and the occurrence of oxidization, etc., can be reduced.

By setting the width W2 of the first part 51 to be not more than the width W3 of the first region 11*a*, the first part 51 is not positioned on the p-side layer 13, and the optical absorption by the n-side electrode 50 positioned on the p-side layer 13 can be reduced.

Figure 13:
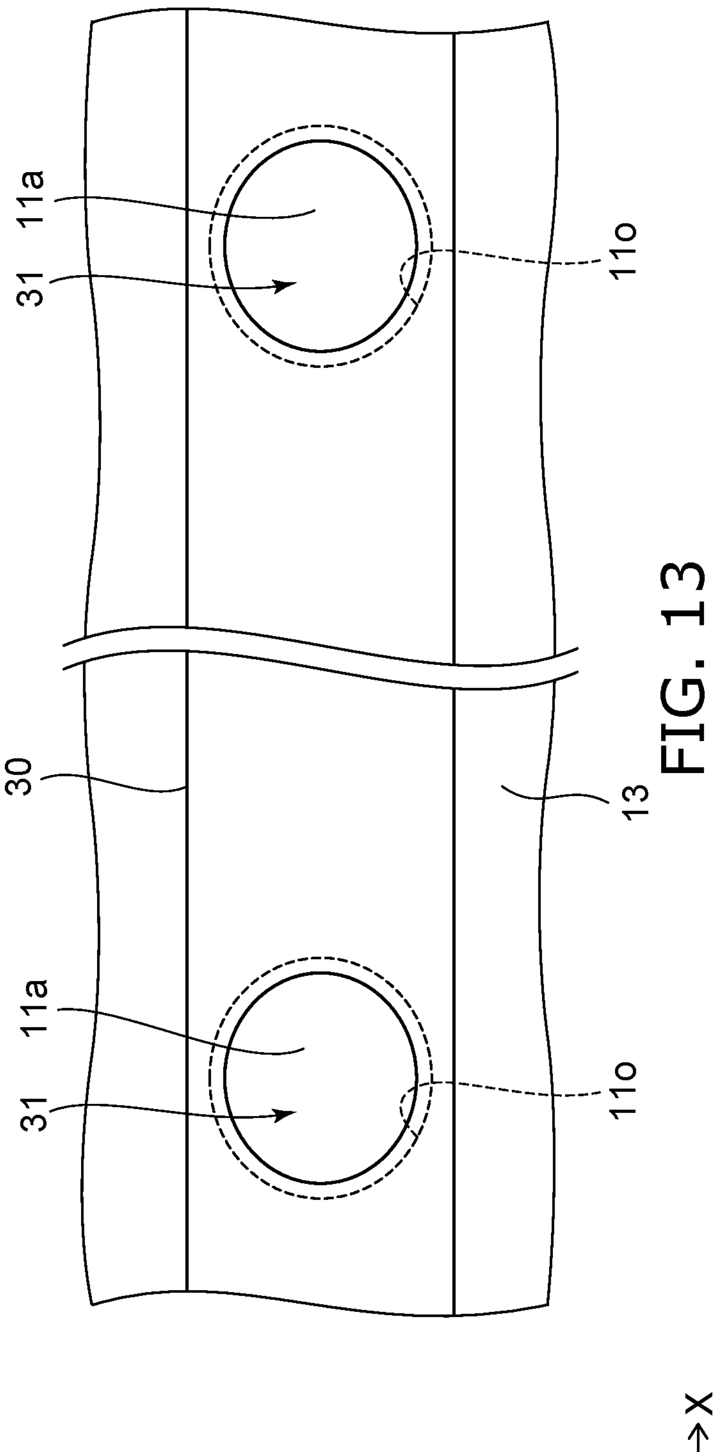
FIG. 13 is a schematic top view of a portion of a light-emitting element according to a second modification of the first embodiment.

FIG. 13 is a schematic top view of one portion of a light-emitting element according to a second modification of the first embodiment. Whereas multiple first insulating films 30 are included according to the first embodiment, one first insulating film 30 is included according to the second modification of the first embodiment. FIG. 13 shows the arrangement relationship between the first insulating film 30 and the first region 11*a* in the top view.

Leakage current between the p-side layer 13 and the first region 11*a* occur particularly easily at an outer edge 11*o*. According to the second modification, the width, in the second direction Y, of the first insulating film 30 is greater than the width, in the second direction Y, of the first region 11*a* in the top view, and the first insulating film 30 continuously covers the outer edge 11*o* of the multiple first regions 11*a*. Accordingly, leakage current between the p-side layer 13 and the outer edge 11*o* of the first region 11*a* does not easily occur.

The first insulating film 30 continuously covers the multiple first regions 11*a* and extends continuously in the first direction X. Multiple third openings 31 are formed in the first insulating film 30 to correspond to the multiple first regions 11*a*. The first region 11*a* is exposed from the first insulating film 30 in the third opening 31.

Second Embodiment

Figure 14:
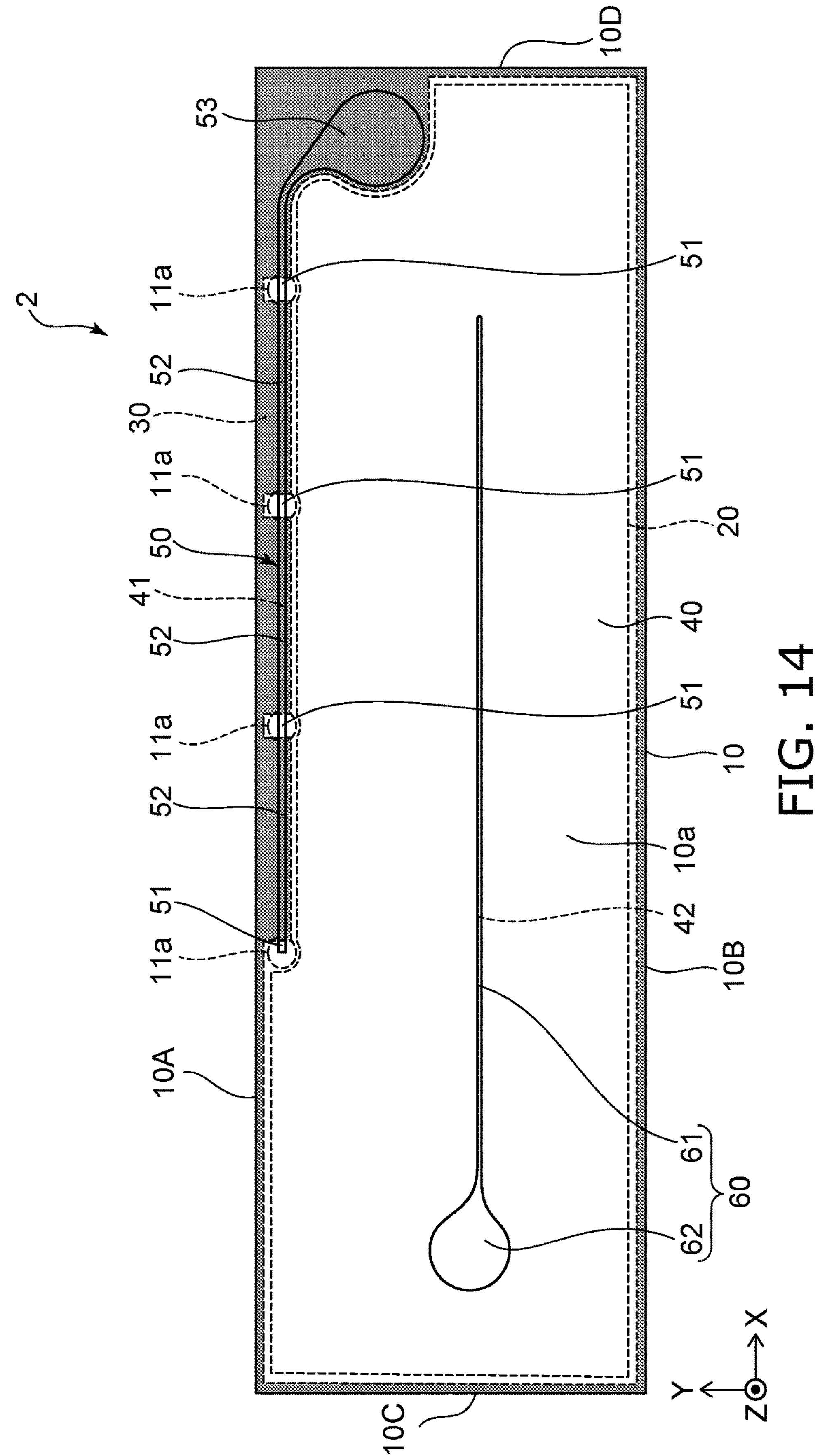
FIG. 14 is a schematic top view of a light-emitting element of a second embodiment.

A light-emitting element 2 according to a second embodiment will now be described with reference to FIG. 14. In FIG. 14, the first insulating film 30 is illustrated by cross hatching.

According to the second embodiment, the first insulating film 30 is located on the p-side layer 13 positioned between the multiple first regions 11*a* and at the outer perimeter portion of the semiconductor structure body 10 in the top view. As shown in FIG. 14, the first insulating film 30 can be continuous on the p-side layer 13 positioned between the multiple first regions 11*a* and at the outer perimeter portion of the semiconductor structure body 10. The light-transmitting conductive layer 20 is not located at the outer perimeter portion of the semiconductor structure body 10. The outer perimeter portion of the semiconductor structure body 10 refers to the area within 20 μm inward from the first to fourth outer edges 10A to 10D of the semiconductor structure body 10 in the top view.

The outer perimeter portion of the semiconductor structure body 10 includes the n-side layer 11, the active layer 12 located on the n-side layer 11, and the p-side layer 13 located on the active layer 12. The first insulating film 30 is located on the p-side layer 13 of the outer perimeter portion of the semiconductor structure body 10. The electrical resistance of the p-side layer 13 in the region positioned below the first insulating film 30 is greater than the electrical resistance of the p-side layer 13 in the region not positioned below the first insulating film 30. That is, the electrical resistance of the p-side layer 13 at the outer perimeter portion is greater than the electrical resistance of the p-side layer 13 inward of the outer perimeter portion. Accordingly, for example, even when semiconductor debris is adhered to the outer surface of the semiconductor structure body 10, leakage current between the p-side layer 13 and the n-side layer 11 via the semiconductor debris does not easily occur.

In the manufacturing processes of the light-emitting element 2, the first insulating film 30 is formed in the region at which the n-side electrode 50 is located in the wafer state before singulating into light-emitting elements, and in the region that becomes the outer perimeter portion of the semiconductor structure body 10 in the light-emitting element after singulation. For example, the first insulating film 30 is formed in a lattice shape in the top view in the wafer state before singulating into light-emitting elements. By providing the first insulating film 30 on the p-side layer 13 at the outer perimeter portion of the semiconductor structure body 10, hydrogen does not easily desorb from the p-side layer 13 at the outer perimeter portion when heat-treating the semiconductor structure body 10 described above, and the electrical resistance of the p-side layer 13 is not easily reduced at the outer perimeter portion. Accordingly, for example, even when semiconductor debris is generated and adheres to the outer surface of the semiconductor structure body 10 when subdividing the wafer, leakage current between the p-side layer 13 and the n-side layer 11 via the semiconductor debris does not easily occur.

Third Embodiment

Figure 15:
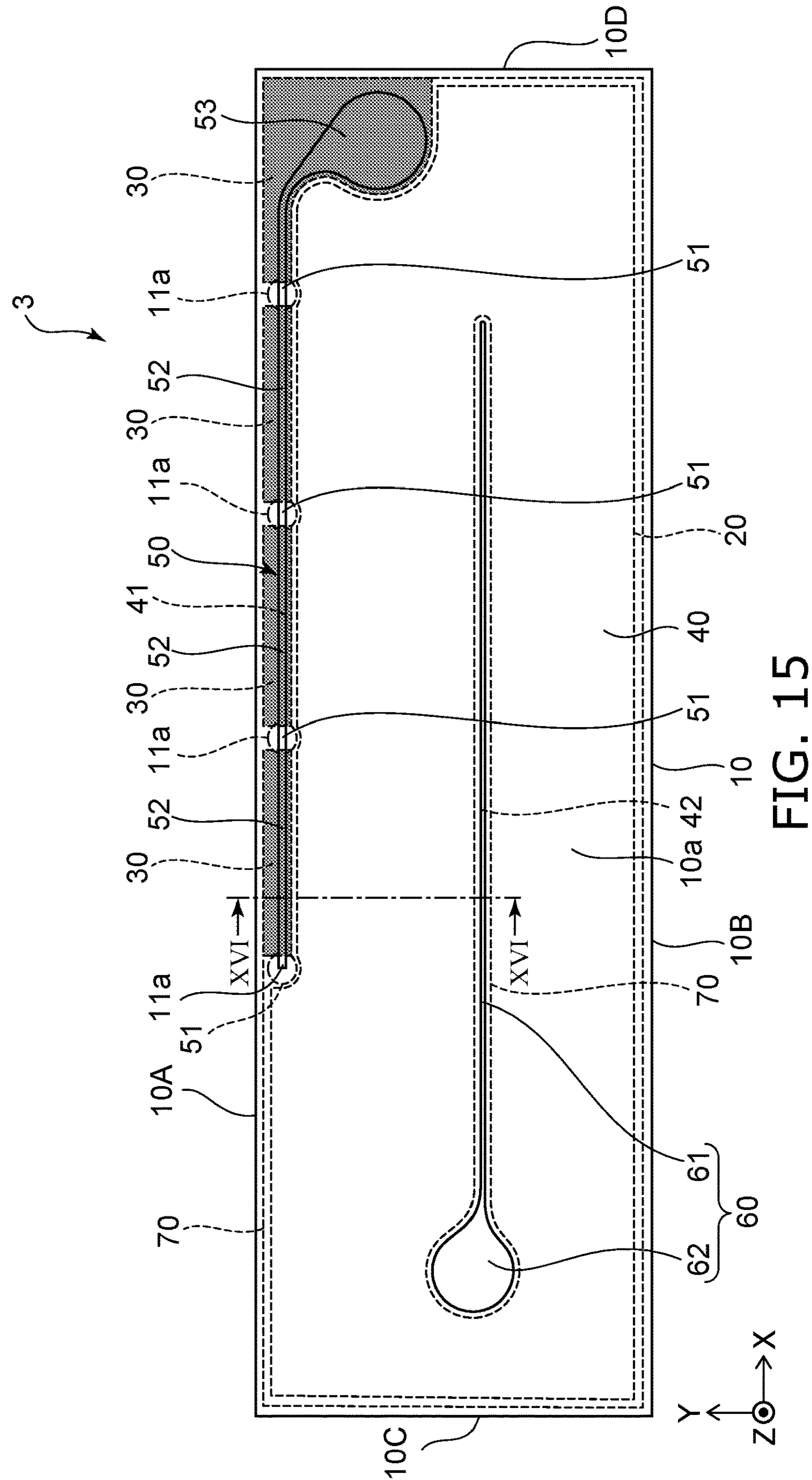
FIG. 15 is a schematic top view of a light-emitting element of a third embodiment.
Figure 16:
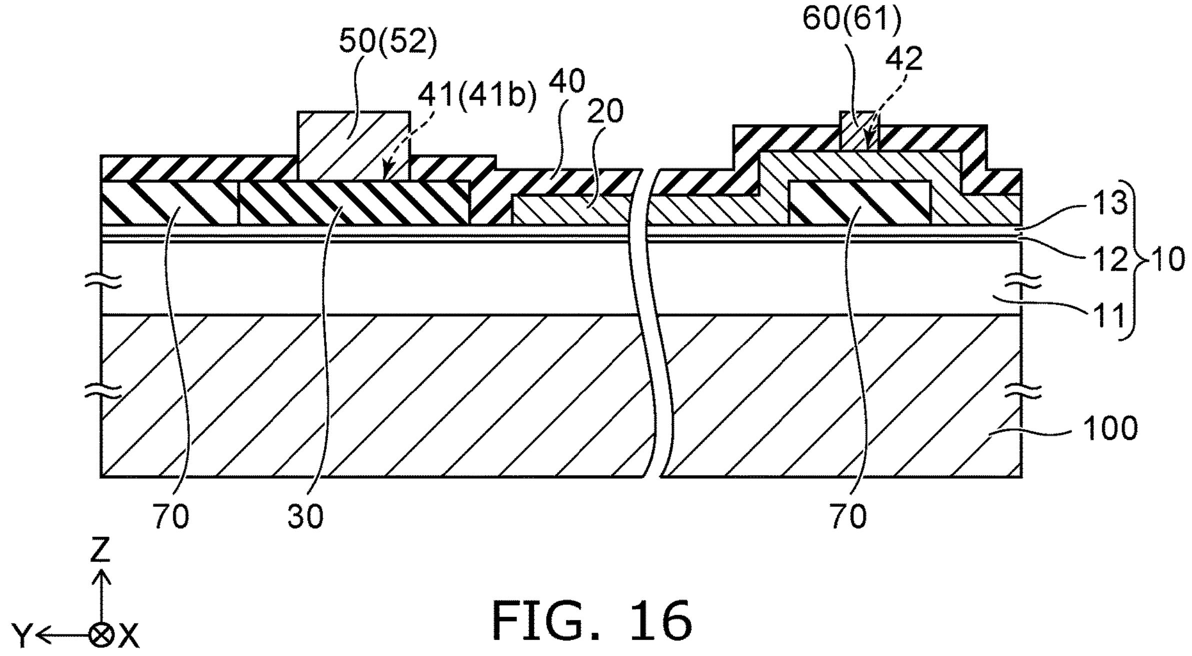
FIG. 16 is a schematic cross-sectional view along line XVI-XVI of FIG. 15.

A light-emitting element 3 of a third embodiment will now be described with reference to FIGS. 15 to 17. In FIG. 15, the first insulating film 30 is illustrated by cross hatching.

According to the third embodiment, a third insulating film 70 other than the first insulating film 30 is located at the outer perimeter portion of the semiconductor structure body 10. As shown in FIG. 16, the third insulating film 70 is located on the p-side layer 13 at the outer perimeter portion of the semiconductor structure body 10. The electrical resistance of the p-side layer 13 in the region positioned below the third insulating film 70 is greater than the electrical resistance of the p-side layer 13 in the region not positioned below the third insulating film 70. That is, the electrical resistance of the p-side layer 13 at the outer perimeter portion is greater than the electrical resistance of the p-side layer 13 inward of the outer perimeter portion. Accordingly, for example, even when semiconductor debris is adhered to the outer surface of the semiconductor structure body 10, leakage current between the p-side layer 13 and the n-side layer 11 via the semiconductor debris does not easily occur. As shown in FIG. 16, the width, in the second direction Y, of the n-side electrode 50 according to the third embodiment is equal to the width, in the second direction Y, of the n-side opening 41, and the width, in the second direction Y, of the p-side electrode 60 is equal to the width, in the second direction Y, of the p-side opening 42.

The n-side opening 41 is not formed in the second insulating film 40 at the outer perimeter portion of the semiconductor structure body 10. Accordingly, the third insulating film 70 that is located at the outer perimeter portion of the semiconductor structure body 10 does not need resistance to etching when forming the n-side opening 41 in the second insulating film 40. Accordingly, a film of a different material from the first insulating film 30 can be selected as the third insulating film 70. For example, according to the third embodiment, the third insulating film 70 can be a film having a lower optical absorptance for the light emitted by the active layer 12 than the first insulating film 30. For example, by using a silicon oxide film as the third insulating film 70, the absorption of the light by the third insulating film 70 can be less than when a silicon nitride film is used.

The third insulating film 70 also can be located under the p-side electrode 60. As shown in FIG. 16, the third insulating film 70 is located on the p-side layer 13 between the p-side layer 13 and the p-side electrode 60, the light-transmitting conductive layer 20 is located on the third insulating film 70, and the p-side electrode 60 is located on the light-transmitting conductive layer 20. The light-transmitting conductive layer 20 contacts the p-side layer 13 in the region at which the first insulating film 30 and the third insulating film 70 are not located, and the p-side electrode 60 is electrically connected with the p-side layer 13 via the light-transmitting conductive layer 20. By providing the third insulating film 70 under the p-side electrode 60, the light that is emitted by the active layer 12 can be totally reflected at the interface between the p-side layer 13 and the third insulating film 70. The absorption of the light by the p-side electrode 60 can be reduced thereby. It is favorable for the thickness of the third insulating film 70 to be greater than the thickness of the second insulating film 40. By setting the thickness of the third insulating film 70 to be greater than the thickness of the second insulating film 40, the light that is emitted by the active layer 12 can be easily totally reflected by the interface between the p-side layer 13 and the third insulating film 70. For example, the thickness of the third insulating film 70 can be not less than 50 nm and not more than 1000 nm, and favorably not less than 200 nm and not more than 400 nm.

Figure 17:
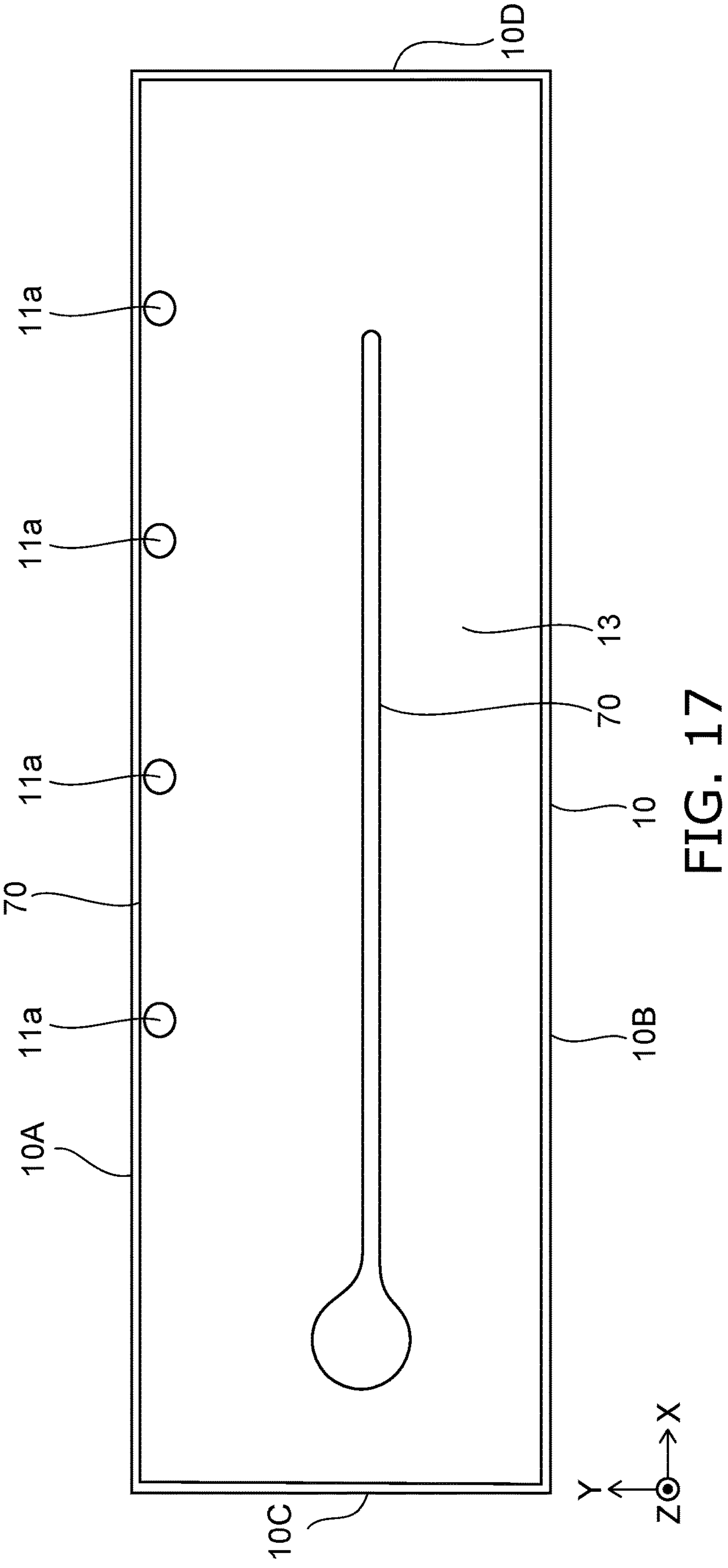
FIG. 17 is a schematic top view for describing processes of a method for manufacturing the light-emitting element of the third embodiment.

As shown in FIG. 17, after the multiple first regions 11*a* are formed in the semiconductor structure body 10 and before forming the light-transmitting conductive layer 20, the third insulating film 70 is formed at the outer perimeter portion of the semiconductor structure body 10 and in the region at which the p-side electrode 60 will be located. For example, the third insulating film 70 is formed in a lattice shape in the top view in the wafer state before singulating into light-emitting elements.

After the third insulating film 70 is formed, the process of FIG. 7 and subsequent processes are performed. The heat treatment of the semiconductor structure body 10 for causing the hydrogen to desorb from the p-side layer 13 is performed after the third insulating film 70 is formed. As described above, due to the third insulating film 70, the hydrogen does not easily desorb from the p-side layer 13 at the outer perimeter portion of the semiconductor structure body 10, and the electrical resistance of the p-side layer 13 at the outer perimeter portion of the semiconductor structure body 10 is not easily reduced.

The first insulating film 30 is formed after the third insulating film 70 is formed. By performing the heat treatment of the semiconductor structure body 10 after the third and first insulating films 70 and 30 are formed, the reliability of the light-emitting element can be efficiently increased because the electrical resistance of the p-side layer 13 at the outer perimeter portion of the semiconductor structure body 10 and the electrical resistance of the p-side layer 13 under the n-side electrode 50 simultaneously can be made less likely to decrease. By performing the heat treatment of the semiconductor structure body 10 after the third insulating film 70 is formed and before forming the first insulating film 30, the region of the p-side layer 13 at which the electrical resistance is not reduced can be only the region in which the third insulating film 70 is formed. As a result, the forward voltage of the light-emitting element can be less than when the heat treatment of the semiconductor structure body 10 is performed after the third and first insulating films 70 and 30 are formed.

What is claimed is:

1. A method for manufacturing a light-emitting element, the method comprising:

preparing a semiconductor structure body that comprises:
- an n-side layer,
- a p-side layer, and
- an active layer positioned between the n-side layer and the p-side layer, wherein:
- the n-side layer includes a plurality of first regions arranged in a first direction in a top view, the plurality of first regions exposed from the active layer and the p-side layer;

forming a first insulating film on the p-side layer, between the plurality of first regions;

forming a second insulating film to continuously cover the first regions, the p-side layer, and the first insulating film;

forming an n-side opening in the second insulating film by removing the second insulating film on the first regions and on the first insulating film, wherein the n-side opening is continuous in the first direction in the top view, and wherein the first regions and the first insulating film from the second insulating film in the n-side opening; and forming an n-side electrode in the n-side opening, the n-side electrode contacting the first regions and the first insulating film, wherein:

in the top view, a width of the n-side opening in a second direction, orthogonal to the first direction, is not more than a width of the first insulating film in the second direction.

2. The method according to claim 1, wherein:

the n-side opening includes:
- a first opening positioned on the first region, and
- a second opening positioned on the first insulating film, in the top view, a width of the first opening in the second direction is greater than a width of the second opening in the second direction, the n-side electrode includes:
- a first part positioned at the first opening, and
- a second part positioned at the second opening, and in the top view, a width of the first part in the second direction is greater than a width of the second part in the second direction.

3. The method according to claim 2, wherein:

in the top view, the width of the first part of the n-side electrode in the second direction is not less than the width of the first opening of the n-side opening in the second direction and not more than a width in of the first region the second direction.

4. The method according to claim 1, wherein:

the forming of the n-side opening in the second insulating film comprises removing the second insulating film by using an etching condition so that an etching rate of the first insulating film is less than an etching rate of the second insulating film.

5. The method according to claim 1, wherein:

a thickness of the first insulating film is greater than a thickness of the second insulating film.

6. The method according to claim 1, wherein:

in the top view, the first insulating film continuously covers outer edges of the plurality of first regions.

7. The method according to claim 1, wherein:

in the top view, a width of the first insulating film in the second direction is less than a width of the first region in the second direction.

8. The method according to claim 1, wherein:

the first insulating film is a silicon nitride film, and the second insulating film is a silicon oxynitride film.

9. The method according to claim 1, wherein:

the preparing of the semiconductor structure body comprises forming a light-transmitting conductive layer on the p-side layer in a region other than a region between the first regions in the top view, and the method further comprises, after the forming of the first insulating film, heat-treating the semiconductor structure body.

10. A light-emitting element comprising:

a semiconductor structure body comprising:

an n-side layer, a p-side layer, and an active layer positioned between the n-side layer and the p-side layer, wherein:

the n-side layer includes a plurality of first regions arranged in a first direction in a top view, the plurality of first regions exposed from the active layer and the p-side layer;

a first insulating film located on the p-side layer, between the plurality of first regions;

a second insulating film located on the first regions, on the p-side layer, and on the first insulating film, wherein the second insulating film includes an n-side opening continuous in the first direction in the top view, and wherein the first regions and the first insulating film are exposed from the second insulating film in the n-side opening; and an n-side electrode located in the n-side opening, the n-side electrode contacting the first regions and the first insulating film, wherein:

in the top view, a width of the n-side opening in a second direction, orthogonal to the first direction, is not more than a width of the first insulating film in the second direction.

11. The element according to claim 10, wherein:

the n-side opening includes:

a first opening positioned on the first region, and a second opening positioned on the first insulating film, in the top view, a width of the first opening in the second direction is greater than a width of the second opening in the second direction, the n-side electrode includes:

a first part positioned at the first opening, and a second part positioned at the second opening, and in the top view, a width of the first part in the second direction is greater than a width of the second part in the second direction.

12. The element according to claim 11, wherein:

in the top view, the width of the first part of the n-side electrode in the second direction is not less than the width of the first opening of the n-side opening in the second direction and not more than a width of the first region in the second direction.

13. The element according to claim 10, wherein:

a thickness of the first insulating film is greater than a thickness of the second insulating film.

14. The element according to claim 10, wherein:

the first insulating film continuously covers outer edges of the plurality of first regions in the top view.

15. The element according to claim 10, wherein:

in the top view, a width of the first insulating film in the second direction is less than a width of the first region in the second direction.

16. The element according to claim 10, wherein:

the first insulating film is a silicon nitride film, and the second insulating film is a silicon oxynitride film.

17. The element according to claim 10, further comprising:

a light-transmitting conductive layer located on the p-side layer, the light-transmitting conductive layer being located at a position at which the light-transmitting conductive layer does not overlap the first insulating film in the top view.

* * * * *